(12) United States Patent
Lin et al.

(10) Patent No.: US 8,861,170 B2
(45) Date of Patent: Oct. 14, 2014

(54) ELECTROSTATIC CHUCK WITH PHOTO-PATTERNABLE SOFT PROTRUSION CONTACT SURFACE

(71) Applicant: Entegris, Inc., Billerica, MA (US)

(72) Inventors: I-Kuan Lin, Lexington, MA (US); Richard A. Cooke, Framingham, MA (US); Jakub Rybczynski, Arlington, MA (US)

(73) Assignee: Entegris, Inc., Billerica, MA (US)

( * ) Notice: Subject to any disclaimer, the term of this patent is extended or adjusted under 35 U.S.C. 154(b) by 145 days.

(21) Appl. No.: 13/667,516

(22) Filed: Nov. 2, 2012

(65) Prior Publication Data

US 2013/0120897 A1 May 16, 2013

Related U.S. Application Data

(63) Continuation-in-part of application No. 13/266,657, filed as application No. PCT/US2010/034667 on May 13, 2010.

(60) Provisional application No. 61/216,305, filed on May 15, 2009.

(51) Int. Cl.
  *H02N 13/00* (2006.01)
  *C23C 16/458* (2006.01)
  *H01L 21/683* (2006.01)
  *H01L 21/687* (2006.01)

(52) U.S. Cl.
  CPC ............ *H02N 13/00* (2013.01); *C23C 16/4581* (2013.01); *H01L 21/6831* (2013.01); *H01L 21/6875* (2013.01); *H01L 21/68757* (2013.01)
  USPC .......................................... 361/234

(58) Field of Classification Search
  CPC ............ H02N 13/00; H01L 21/68757; H01L 21/6875; H01L 21/6831; C23C 16/4581
  USPC .......................................... 361/234
  See application file for complete search history.

(56) References Cited

U.S. PATENT DOCUMENTS 4,184,188 A  1/1980  Briglia
5,179,498 A  1/1993  Hongoh et al.
(Continued)

FOREIGN PATENT DOCUMENTS

CN  101043018  9/2007
EP  1 119 040 A2  7/2001
(Continued)

OTHER PUBLICATIONS

Notification of Transmittal of the International Search Report and Written Opinion of the International Searching Authority from counterpart International Application No. PCT/US2010/034667, Dated Feb. 1, 2011.

(Continued)

*Primary Examiner* — Scott Bauer
(74) *Attorney, Agent, or Firm* — Hamilton, Brook, Smith & Reynolds, P.C.

(57) ABSTRACT

In accordance with an embodiment of the invention, there is provided a soft protrusion structure for an electrostatic chuck, which offers a non-abrasive contact surface for wafers, workpieces or other substrates, while also having improved manufacturability and compatibility with grounded surface platen designs. The soft protrusion structure comprises a photo-patternable polymer.

25 Claims, 6 Drawing Sheets

(56) References Cited

U.S. PATENT DOCUMENTS

| | | |
|---|---|---|
| 5,250,137 A | 10/1993 | Arami et al. |
| 5,310,453 A | 5/1994 | Fukasawa et al. |
| 5,350,479 A | 9/1994 | Collins et al. |
| 5,382,311 A | 1/1995 | Ishikawa et al. |
| 5,413,360 A | 5/1995 | Atari et al. |
| 5,539,609 A | 7/1996 | Collins et al. |
| 5,557,215 A | 9/1996 | Saeki et al. |
| 5,583,736 A * | 12/1996 | Anderson et al. ............ 361/234 |
| 5,583,737 A | 12/1996 | Collins et al. |
| 5,591,269 A | 1/1997 | Arami et al. |
| 5,625,526 A | 4/1997 | Watanabe et al. |
| 5,656,093 A | 8/1997 | Burkhart et al. |
| 5,691,876 A | 11/1997 | Chen et al. |
| 5,701,228 A | 12/1997 | Ishii |
| 5,740,009 A | 4/1998 | Pu et al. |
| 5,748,434 A | 5/1998 | Rossman et al. |
| 5,761,023 A | 6/1998 | Lue et al. |
| 5,764,471 A | 6/1998 | Burkhart |
| 5,777,838 A | 7/1998 | Tamagawa et al. |
| 5,779,803 A | 7/1998 | Kurono et al. |
| 5,792,562 A | 8/1998 | Collins et al. |
| 5,800,871 A | 9/1998 | Collins et al. |
| 5,825,607 A | 10/1998 | Burkhart |
| 5,851,298 A | 12/1998 | Ishii |
| 5,868,848 A | 2/1999 | Tsukamoto |
| 5,870,271 A | 2/1999 | Herchen |
| 5,880,924 A | 3/1999 | Kumar et al. |
| 5,886,865 A | 3/1999 | Parkhe et al. |
| 5,886,866 A | 3/1999 | Hausmann |
| 5,903,428 A | 5/1999 | Grimard et al. |
| 5,908,334 A | 6/1999 | Chen et al. |
| 5,914,568 A | 6/1999 | Nonaka |
| 5,916,689 A | 6/1999 | Collins et al. |
| 5,923,521 A | 7/1999 | Burkhart |
| 5,946,183 A | 8/1999 | Yamada et al. |
| 5,946,184 A | 8/1999 | Kanno et al. |
| 5,997,962 A | 12/1999 | Ogasawara et al. |
| 6,028,762 A | 2/2000 | Kamitani |
| 6,051,122 A | 4/2000 | Flanigan |
| 6,055,150 A | 4/2000 | Clinton et al. |
| 6,072,685 A | 6/2000 | Herchen |
| 6,081,414 A | 6/2000 | Flanigan et al. |
| 6,088,213 A | 7/2000 | Herchen |
| 6,104,595 A | 8/2000 | Brown |
| 6,104,596 A | 8/2000 | Hausmann |
| 6,108,189 A | 8/2000 | Weldon et al. |
| 6,117,246 A | 9/2000 | Parkhe et al. |
| 6,125,025 A | 9/2000 | Howald et al. |
| 6,134,096 A | 10/2000 | Yamada et al. |
| 6,175,485 B1 | 1/2001 | Krishnaraj et al. |
| 6,198,616 B1 | 3/2001 | Dahimene et al. |
| 6,215,640 B1 | 4/2001 | Hausmann |
| 6,217,655 B1 | 4/2001 | Kumar et al. |
| 6,243,251 B1 | 6/2001 | Kanno et al. |
| RE37,294 E | 7/2001 | Knapp et al. |
| 6,259,592 B1 | 7/2001 | Ono |
| 6,304,424 B1 | 10/2001 | Mett et al. |
| 6,338,861 B1 | 1/2002 | Gozu et al. |
| 6,370,004 B1 | 4/2002 | Yamaguchi |
| 6,373,681 B2 | 4/2002 | Kanno et al. |
| 6,414,834 B1 | 7/2002 | Weldon et al. |
| 6,433,346 B1 | 8/2002 | Hirayanagi |
| 6,441,939 B1 | 8/2002 | Bigo et al. |
| 6,452,775 B1 | 9/2002 | Nakajima |
| 6,475,336 B1 | 11/2002 | Hubacek |
| 6,483,690 B1 | 11/2002 | Nakajima et al. |
| 6,490,145 B1 | 12/2002 | Kholodenko et al. |
| 6,522,519 B1 | 2/2003 | Hirayanagi |
| 6,567,257 B2 | 5/2003 | Brown |
| 6,608,745 B2 | 8/2003 | Tsuruta et al. |
| 6,625,003 B2 | 9/2003 | Loo et al. |
| 6,628,503 B2 | 9/2003 | Sogard |
| 6,634,177 B2 | 10/2003 | Lin et al. |
| 6,641,939 B1 | 11/2003 | Lee et al. |
| 6,646,233 B2 | 11/2003 | Kanno et al. |
| 6,678,143 B2 | 1/2004 | Masuda et al. |
| 6,687,113 B2 | 2/2004 | Saito et al. |
| 6,721,162 B2 | 4/2004 | Weldon et al. |
| 6,723,274 B1 | 4/2004 | Divakar |
| 6,754,062 B2 | 6/2004 | Logan et al. |
| 6,785,115 B2 | 8/2004 | Tsuruta et al. |
| 6,790,375 B1 | 9/2004 | Howald et al. |
| 6,813,134 B2 | 11/2004 | Tatsumi et al. |
| 6,835,415 B2 | 12/2004 | Blaedel et al. |
| 6,839,217 B1 | 1/2005 | Larsen |
| 6,853,953 B2 | 2/2005 | Brcka et al. |
| 6,950,297 B2 | 9/2005 | Kosakai |
| 6,982,125 B2 | 1/2006 | LaCourse et al. |
| 7,042,697 B2 | 5/2006 | Tsuruta et al. |
| 7,052,553 B1 | 5/2006 | Shih et al. |
| 7,075,771 B2 | 7/2006 | Brcka |
| 7,078,655 B1 | 7/2006 | Ito et al. |
| 7,088,431 B2 | 8/2006 | Ottens et al. |
| 7,142,405 B2 | 11/2006 | Miyaji et al. |
| 7,175,737 B2 | 2/2007 | Sago et al. |
| 7,187,433 B2 | 3/2007 | Ottens et al. |
| 7,196,896 B2 | 3/2007 | Howald et al. |
| 7,198,276 B2 | 4/2007 | Caldwell et al. |
| 7,209,339 B2 | 4/2007 | Kitabayashi et al. |
| 7,220,319 B2 | 5/2007 | Sago et al. |
| 7,307,697 B2 | 12/2007 | GanapathiSubramanian et al. |
| 7,330,346 B2 | 2/2008 | Ikuhara et al. |
| 7,335,315 B2 | 2/2008 | Matsuda et al. |
| 7,824,498 B2 | 11/2010 | Parkhe et al. |
| 2001/0019472 A1 | 9/2001 | Kanno et al. |
| 2001/0055190 A1 | 12/2001 | Saito et al. |
| 2002/0000521 A1 | 1/2002 | Brown |
| 2002/0008954 A1 | 1/2002 | Leeser |
| 2002/0012219 A1 | 1/2002 | Tsuruta et al. |
| 2002/0021545 A1 | 2/2002 | Tatsumi et al. |
| 2002/0027762 A1 | 3/2002 | Yamaguchi |
| 2002/0036373 A1* | 3/2002 | Kosakai ......................... 269/21 |
| 2002/0109955 A1 | 8/2002 | Masuda et al. |
| 2002/0130276 A1 | 9/2002 | Sogard |
| 2002/0135969 A1 | 9/2002 | Weldon et al. |
| 2002/0144657 A1 | 10/2002 | Chiang et al. |
| 2002/0144786 A1 | 10/2002 | Chiang et al. |
| 2002/0146511 A1 | 10/2002 | Chiang et al. |
| 2002/0159217 A1 | 10/2002 | Tsuruta et al. |
| 2002/0167779 A1* | 11/2002 | Carroll et al. ................. 361/234 |
| 2002/0170882 A1 | 11/2002 | Akiba |
| 2003/0010292 A1 | 1/2003 | Kholodenko et al. |
| 2003/0053283 A1 | 3/2003 | Loo et al. |
| 2003/0095370 A1 | 5/2003 | Tsuruta et al. |
| 2003/0123213 A1 | 7/2003 | Kosakai |
| 2003/0165043 A1 | 9/2003 | Logan et al. |
| 2003/0168439 A1 | 9/2003 | Kanno et al. |
| 2004/0040665 A1 | 3/2004 | Mizuno et al. |
| 2004/0055709 A1 | 3/2004 | Boyd, Jr. et al. |
| 2004/0070916 A1 | 4/2004 | Tsuruta et al. |
| 2004/0121192 A1 | 6/2004 | LaCourse et al. |
| 2004/0124595 A1 | 7/2004 | Miyaji et al. |
| 2004/0131775 A1 | 7/2004 | Blaedel et al. |
| 2004/0160021 A1 | 8/2004 | Tatsumi et al. |
| 2004/0173469 A1 | 9/2004 | Udo et al. |
| 2004/0190215 A1 | 9/2004 | Weldon et al. |
| 2004/0233608 A1 | 11/2004 | Brcka |
| 2004/0233609 A1 | 11/2004 | Yoshida et al. |
| 2005/0018377 A1 | 1/2005 | Cho et al. |
| 2005/0029244 A1 | 2/2005 | Ito et al. |
| 2005/0036268 A1 | 2/2005 | Howald et al. |
| 2005/0045106 A1 | 3/2005 | Boyd, Jr. et al. |
| 2005/0069726 A1 | 3/2005 | Douglas et al. |
| 2005/0079737 A1 | 4/2005 | Kellerman et al. |
| 2005/0087939 A1 | 4/2005 | Caldwell et al. |
| 2005/0095410 A1 | 5/2005 | Mazurkiewicz |
| 2005/0106320 A1 | 5/2005 | Mehregany et al. |
| 2005/0263077 A1 | 12/2005 | GanapathiSubramanian et al. |
| 2005/0264134 A1 | 12/2005 | GanapathiSubramanian et al. |
| 2006/0108231 A1 | 5/2006 | Weichart |
| 2006/0112969 A1 | 6/2006 | Shih et al. |
| 2006/0121195 A1 | 6/2006 | Udo et al. |
| 2006/0158823 A1 | 7/2006 | Mizuno et al. |
| 2007/0047170 A1 | 3/2007 | Sun et al. |

(56) References Cited

U.S. PATENT DOCUMENTS

| | | |
|---|---|---|
| 2007/0109714 A1 | 5/2007 | Chung |
| 2007/0128570 A1 | 6/2007 | Goto et al. |
| 2007/0195482 A1 | 8/2007 | Muka et al. |
| 2007/0217114 A1 | 9/2007 | Sasaki et al. |
| 2007/0217118 A1 | 9/2007 | Ikuhara et al. |
| 2007/0222131 A1 | 9/2007 | Fukumoto et al. |
| 2007/0223173 A1 | 9/2007 | Fujisawa et al. |
| 2007/0253139 A1 | 11/2007 | Nakano et al. |
| 2007/0258184 A1 | 11/2007 | Lee |
| 2007/0258186 A1 | 11/2007 | Matyushkin et al. |
| 2007/0283891 A1 | 12/2007 | Okayama |
| 2008/0017104 A1 | 1/2008 | Matyushkin et al. |
| 2008/0037195 A1 | 2/2008 | Himori et al. |
| 2008/0037196 A1 | 2/2008 | Yonekura et al. |
| 2008/0041312 A1 | 2/2008 | Matsuyama et al. |
| 2008/0062609 A1 | 3/2008 | Himori et al. |
| 2008/0062610 A1 | 3/2008 | Himori et al. |
| 2008/0062611 A1 | 3/2008 | Himori et al. |
| 2008/0062612 A1 | 3/2008 | Morioka et al. |
| 2008/0073032 A1 | 3/2008 | Koshiishi et al. |
| 2008/0083700 A1 | 4/2008 | Bernard et al. |
| 2008/0100983 A1 | 5/2008 | Purohit et al. |
| 2008/0106842 A1 | 5/2008 | Ito et al. |
| 2008/0144251 A1 | 6/2008 | Tao et al. |
| 2008/0239614 A1 | 10/2008 | Blake et al. |
| 2009/0242544 A1 | 10/2009 | Kano |
| 2009/0284894 A1 | 11/2009 | Cooke |
| 2012/0044609 A1 | 2/2012 | Cooke et al. |
| 2013/0070384 A1 | 3/2013 | Cooke et al. |

FOREIGN PATENT DOCUMENTS

| | | |
|---|---|---|
| EP | 1 801 961 A2 | 6/2007 |
| JP | 02-027748 A | 3/1990 |
| JP | 02-304946 A | 12/1990 |
| JP | 5243367 A | 9/1993 |
| JP | H05243367 | 9/1993 |
| JP | 11-214494 A | 6/1999 |
| JP | 2000100917 | 4/2000 |
| JP | 2002-141404 A | 5/2002 |
| JP | 2002-299425 A | 10/2002 |
| JP | 2003-060020 | 2/2003 |
| JP | 2003282688 A | 10/2003 |
| JP | 200422889 | 1/2004 |
| JP | 200533125 A | 2/2005 |
| JP | 2007158286 A | 6/2007 |
| JP | 2007-194320 A | 8/2007 |
| KR | 10-2005-0064912 A | 6/2005 |
| KR | 10-2006-0081562 | 7/2006 |
| KR | 100717694 B1 | 5/2007 |
| KR | 10-2007-0066890 A | 6/2007 |
| KR | 10-0755874 B1 | 9/2007 |
| WO | WO 99/16122 | 4/1999 |
| WO | WO 99/25006 | 5/1999 |
| WO | WO 99/29001 | 6/1999 |
| WO | WO 99/48148 | 9/1999 |
| WO | WO 99/52144 | 10/1999 |
| WO | WO 99/54928 | 10/1999 |
| WO | WO 99/57753 | 11/1999 |
| WO | WO 99/60613 | 11/1999 |
| WO | WO 99/62115 | 12/1999 |
| WO | WO 00/19519 | 4/2000 |
| WO | WO 00/19592 | 4/2000 |
| WO | WO 00/35003 | 6/2000 |
| WO | WO 01/42163 A2 | 6/2001 |
| WO | WO 02/31219 A1 | 4/2002 |
| WO | WO 03/003449 A2 | 1/2003 |
| WO | WO 03/008666 A1 | 1/2003 |
| WO | WO 2004/027839 A2 | 4/2004 |
| WO | WO 2004/059701 A2 | 7/2004 |
| WO | WO 2004/059714 A1 | 7/2004 |
| WO | WO 2004/107387 A2 | 12/2004 |
| WO | WO 2005/119802 A2 | 12/2005 |
| WO | WO 2006/060234 A2 | 6/2006 |
| WO | WO 2007/043519 A1 | 4/2007 |
| WO | WO 2007/064435 A2 | 6/2007 |
| WO | WO 2007/100571 A2 | 9/2007 |
| WO | WO 2008/088471 A1 | 7/2008 |
| WO | WO 2008/118683 A1 | 10/2008 |
| WO | WO 2009/013803 A1 | 1/2009 |
| WO | WO 2009/142710 A1 | 11/2009 |
| WO | WO 2010/132640 A2 | 11/2010 |
| WO | WO 2011/149918 A2 | 12/2011 |
| WO | WO 2012/033922 | 3/2012 |

OTHER PUBLICATIONS

International Search Report from counterpart International Application No. PCT/US2009/003015, Dated Jul. 16, 2009.
Written Opinion of the International Searching Authority from counterpart International Application No. PCT/US2009/003015, Dated Jul. 16, 2009.
International Preliminary Report on Patentability from counterpart International Application No. PCT/US2009/003015, Dated Dec. 2, 2010.
Non-Final Office Action for U.S. Appl. No. 12/454,336, "Electrostatic Chuck"; Date Mailed: Feb. 26, 2014.
Search Report for Taiwan Application No. 098115989 "Electrostatic Chuck"; Date of Completion: Feb. 17, 2014.
Non-Final Office Action for U.S. Appl. No. 13/699,279, "High Surface Resistivity Electrostatic Chuck"; Date Mailed: Mar. 12, 2014.
Notification of Transmittal of the International Search Report and Written Opinion of the International Searching Authority from counterpart International Application No. PCT/US2013/067301, Dated: Jan. 16, 2014 (10 pgs.).
Non-Final Office Action for U.S. Appl. No. 12/454,336 dated Dec. 20, 2012, "Electrostatic Chuck".
Notification of Transmittal of the International Search Report and Written Opinion of the International Searching Authority from counterpart International Application No. PCT/US2011/037712, "High Surface Resistivity Electrostatic Chuck," Dated: Jan. 10, 2012.
International Preliminary Report on Patentability from counterpart International Application No. PCT/US2011/037712, "High Surface Resistivity Electrostatic Chuck," Dated: Sep. 18, 2012.
Supplementary European Search Report, EP10775520, Dated: Oct. 18, 2013.
Non-Final Office Action for U.S. Appl. No. 12/454,336, titled "Electrostatic Chuck"; Date Mailed: Jul. 10, 2012.
Non-Final Office Action for U.S. Appl. No. 12/454,336, titled "Electrostatic Chuck" ; Date Mailed: Mar. 26, 2013.
Final Office Action for U.S. Appl. No. 12/454,336, titled "Electrostatic Chuck"; Date Mailed: Oct. 15, 2013.
Non-Final Office Action for U.S. Appl. No. 13/266,657, "Electrostatic Chuck with Polymer Protrusions"; Date Mailed: Nov. 8, 2013.
*Notice of Allowance for U.S. Appl. No. 13/266,657, "Electrostatic Chuck with Polymer Protrusions", Date Mailed: Jul. 18, 2014.

* cited by examiner

ELECTROSTATIC CHUCK WITH PHOTO-PATTERNABLE SOFT PROTRUSION CONTACT SURFACE

RELATED APPLICATIONS

This application is a continuation-in-part of U.S. application Ser. No. 13/266,657, filed Oct. 27, 2011, which is the U.S. National Stage of International Application No. PCT/US2010/034667, filed on May 13, 2010, published in English, which claims the benefit of U.S. Provisional Application No. 61/216,305, filed on May 15, 2009. The entire teachings of the above applications are incorporated herein by reference.

BACKGROUND OF THE INVENTION

An electrostatic chuck holds and supports a substrate during a manufacturing process and also removes heat from the substrate without mechanically clamping the substrate. During use of an electrostatic chuck, the back side of a substrate, such as a semiconductor wafer, is held to the face of the electrostatic chuck by an electrostatic force. The substrate is separated from one or more electrodes in the face of the electrostatic chuck by a surface layer of material that covers the electrode. In a Coulombic chuck, the surface layer is electrically insulating, while in a Johnsen-Rahbek electrostatic chuck, the surface layer is weakly conducting. The surface layer of the electrostatic chuck may be flat or may have one or more protrusions, projections or other surface features that further separate the back side of the substrate from the covered electrode. Heat delivered to the substrate during processing can be transferred away from the substrate and to the electrostatic chuck by contact heat conduction with the protrusions and/or by gas heat conduction with a cooling gas. Contact heat conduction is generally more efficient than gas heat conduction in removing heat from the substrate. However, controlling the amount of contact between the substrate and the protrusions can be difficult.

In microelectronics production, as semiconductor and memory device geometries become progressively smaller and the sizes of wafers, flat screen displays, reticles and other processed substrates become progressively larger, the allowable particulate contamination process specifications become more restrictive. The effect of particles on electrostatic chucks is of particular concern because the wafers physically contact or mount to the chuck clamping surface. If the mounting surface of the electrostatic chuck allows any particulate to become entrapped between the mounting surface and the substrate, the substrate may be deformed by the entrapped particle. For example, if the back side of a wafer is clamped electrostatically against a flat reference surface, the entrapped particle could cause a deformation of the front side of the wafer, which will therefore not lie in a flat plane. According to U.S. Pat. No. 6,835,415, studies have shown that a 10-micron particle on a flat electrostatic chuck can displace the surface of a reticle (i.e., a test wafer) for a radial distance of one inch or more. The actual height and diameter of the particle-induced displacement is dependent on numerous parameters such as the particle size, the particle hardness, the clamping force and the reticle thickness.

During substrate processing it is important to be able to control the temperature of the substrate, limit the maximum temperature rise of the substrate, maintain temperature uniformity over the substrate surface, or any combination of these. If there are excessive temperature variations across the substrate surface due to poor and/or non-uniform heat transfer, the substrate can become distorted and process chemistry can be affected. The greater the area of direct contact with the electrostatic chuck, the greater the heat transferred by contact heat conduction. The size of the area of direct contact is a function of the roughness, flatness and hardness of the contact surfaces of the substrate and electrostatic chuck, as well as of the applied pressure between the contact surfaces. Since the characteristics of the contact surface vary from substrate to substrate, and since the characteristics of the contact surface can change over time, accurately controlling contact heat conductance between the electrostatic chuck and substrate is difficult.

Controlling the temperature of a substrate and the number of particles on its back side is important for reducing or eliminating damage to microelectronic devices, reticle masks and other such structures, and for reducing or minimizing manufacturing yield loss. The abrasive properties of the electrostatic chuck protrusions, the high contact area of roughened protrusions, and the effect of lapping and polishing operations during manufacture of electrostatic chucks may all contribute adder particles to the back side of substrates during use with an electrostatic chuck.

SUMMARY OF THE INVENTION

In accordance with an embodiment of the invention, there is provided a soft protrusion structure for an electrostatic chuck, which offers a non-abrasive contact surface for wafers, workpieces or other substrates, while also having improved manufacturability and compatibility with grounded surface platen designs. The soft protrusion structure comprises a photo-patternable polymer.

In one embodiment according to the invention, there is provided an electrostatic chuck comprising a surface layer activated by a voltage in an electrode to form an electric charge to electrostatically clamp a substrate to the electrostatic chuck. The surface layer includes a plurality of protrusions comprising a photo-patternable polymer and a charge control layer to which the plurality of polymer protrusions adhere. The plurality of polymer protrusions extend to a height above portions of the charge control layer surrounding the plurality of polymer protrusions to support the substrate upon the plurality of polymer protrusions during electrostatic clamping of the substrate.

In further, related embodiments, the photo-patternable polymer may comprise a photo-patternable polymer that is liquid at room temperature prior to baking, or may comprise a photo-patternable polymer that is solid at room temperature prior to baking The photo-patternable polymer may comprise an epoxy based, polyimide based or benzocyclobutene based photo-patternable polymer. The charge control layer may comprise silicon carbide or diamond like carbon. The charge control layer may comprise a surface resistivity of between about $10^8$ ohms per square to about $10^{11}$ ohms per square. The polymer protrusions may comprise a height of between about 3 microns and about 12 microns; and may comprise a diameter of about 900 microns. The electrostatic chuck may further comprise a gas seal ring comprising a photo-patternable polymer, such as an epoxy based, benzocyclobutene based or polyimide based photo-patternable polymer. The plurality of polymer protrusions may comprise a surface roughness of between about 0.02 μm and about 0.05 μm. The photo-patternable polymer may comprise a material having a tensile strength of greater than about 70 megapascals (MPa), and may comprise a material having a Young's modulus of less than about 3.5 gigapascals (GPa). The electrostatic chuck may comprise a conductive path covering at least a portion of a workpiece-contacting surface of a gas seal ring of the electrostatic chuck, the conductive path comprising at least a portion of an electrical path to ground. The conductive path may comprise diamond-like carbon.

In another embodiment according to the invention, there is provided an electrostatic chuck comprising a surface layer activated by a voltage in an electrode to form an electric charge to electrostatically clamp a substrate to the electrostatic chuck. The surface layer includes a plurality of protrusions comprising a conductive polymer and a charge control layer to which the plurality of polymer protrusions adhere. The plurality of polymer protrusions extend to a height above portions of the charge control layer surrounding the plurality of polymer protrusions to support the substrate upon the plurality of polymer protrusions during electrostatic clamping of the substrate.

In further, related embodiments, the conductive polymer may comprise a polymer from the group consisting of: a blend of a carbon nanotube and a polymer; and a conductive nanoparticle doped polymer.

In another embodiment according to the invention, there is provided a method of manufacturing an electrostatic chuck. The method comprises exposing a photo-patternable polymer, on a surface of the electrostatic chuck, to light through a mask, the electrostatic chuck comprising a charge control layer underlying at least a portion of the photo-patternable polymer; and removing areas of the surface of the electrostatic chuck based on a pattern of exposure of the surface to the light through the mask, thereby forming a plurality of polymer protrusions on the surface of the electrostatic chuck. The plurality of polymer protrusions adhere to the charge control layer and extend to a height above portions of the charge control layer surrounding the plurality of polymer protrusions.

In further related embodiments, the method may comprise laminating a polymer sheet including the photo-patternable polymer over at least a portion of the charge control layer, or spraying a liquid polymer including the photo-patternable polymer over at least a portion of the charge control layer. The photo-patternable polymer may comprise a material having a tensile strength of greater than about 70 megapascals (MPa) and having a Young's modulus of less than about 3.5 gigapascals (GPa). The method may further comprise covering at least a portion of a workpiece-contacting surface of a gas seal ring of the electrostatic chuck with a conductive path, the conductive path comprising at least a portion of an electrical path to ground.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

In accordance with an embodiment of the invention, there is provided an electrostatic chuck that includes protrusions on its surface for mounting a substrate. The protrusions are formed of a polymer substance, such as polyetherimide (PEI), polyimide or polyether ether ketone (PEEK). Further, the electrostatic chuck features a charge control surface layer, to which the polymer protrusions adhere. The charge control surface layer may be formed of the same polymer substance as the protrusions, such as polyetherimide (PEI), polyimide or polyether ether ketone (PEEK). Such protrusions and charge control surface layer may assist with encouraging contact of the electrostatic chuck with the substrate to promote contact cooling, while also reducing production of undesirable particles.

In another embodiment according to the invention, a photo-patternable polymer may be used to form protrusions and gas seals on an electrostatic chuck, as discussed further below.

Figure 1:
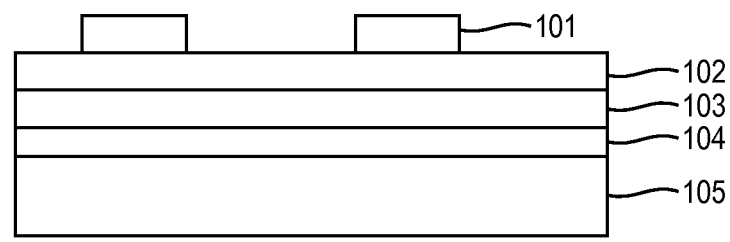
FIG. 1 is a cross-sectional diagram of the top layers of an electrostatic chuck in accordance with an embodiment of the invention.

FIG. 1 is a cross-sectional diagram of the top layers of an electrostatic chuck in accordance with an embodiment of the invention. The electrostatic chuck features protrusions 101 that are formed of a polymer, such as polyetherimide (PEI), polyimide or polyether ether ketone (PEEK). The gas seal rings (not shown) of the electrostatic chuck may be formed of a polymer, such as the same polymer as the protrusions 101. The protrusions 101 adhere to a charge control layer 102, which may also be formed of a polymer. The purpose of the charge control layer 102 is to provide a conductive layer to bleed away surface charge. The charge control layer 102 reduces the likelihood of "wafer sticking," which occurs when a wafer or other substrate electrostatically adheres to the chuck surface after the chuck power is removed. A charge control layer 102 having a surface resistivity in an appropriate range, such as, for example, a range of from about $1 \times 10^8$ ohms/square to about $1 \times 10^{11}$ ohms/square, has been shown to reduce surface charge retention that can lead to undesirable electrostatic force and ultimately to wafer sticking. The slightly conductive surface layer bleeds charge to ground (not shown) while not interfering with the electrostatic attraction between the electrostatic chuck and the substrate. In one embodiment, both the protrusions 101 and the charge control layer 102 are formed of a single polymer, such as polyetherimide (PEI), polyimide or polyether ether ketone (PEEK). An adhesive layer 103 may be underneath the charge control layer 102, and may comprise a different polymer from the charge control layer. In particular, where the charge control layer is formed of polyether ether ketone (PEEK), the adhesive layer 103 may comprise polyetherimide (PEI). Alternatively, the adhesive layer 103 need not be present. Underneath the adhesive layer 103 (or directly underneath the charge control layer 102), the electrostatic chuck includes an adhesion coating 104 that encourages the polymer layers above it to adhere to the dielectric layer 105. The adhesion coating 104 stays buried under the polymer layers above it, and hides cosmetic defects in the polymers. The adhesion coating 104 may, for example, include silicon containing nitrides, oxides, carbides and non-stoichiometric versions of these, for example but not limited to $SiO_xN_y$, silicon nitride, silicon oxide or silicon carbide. The adhesion coating layer may also comprise carbon or a nitride compound of carbon; and may comprise diamond-like carbon; and/or a combination of any of the foregoing. Underneath the adhesion coating 104 is a dielectric layer 105, such as an alumina dielectric.

Figure 2:
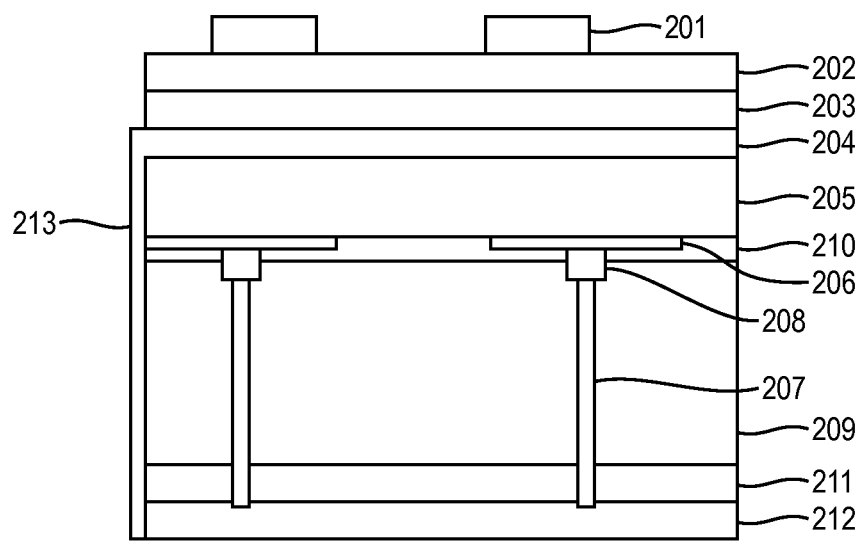
FIG. 2 is a cross-sectional diagram showing further layers of an electrostatic chuck in accordance with an embodiment of the invention.

FIG. 2 is a cross-sectional diagram showing further layers of an electrostatic chuck in accordance with an embodiment of the invention. In addition to protrusions 201, charge control layer 202, adhesive layer 203, adhesion coating 204 and dielectric layer 205, the electrostatic chuck includes metal electrodes 206. The metal electrodes 206 are bonded to electrode pins 207 by electrically conductive epoxy bonds 208. The dielectric layer 205 is bonded to a insulator layer 209, such as an alumina insulator, by a ceramic to ceramic bond 210. The ceramic to ceramic bond 210 may be formed of a polymer, such as polytetrafluoroethylene (PTFE) or modified PTFE (which includes PFA and/or FEP in addition to PTFE). Further, the ceramic to ceramic bond 210 may be formed of polymers such as perfluoroalkoxy (PFA), fluorinated ethylene-propylene (FEP) and polyether ether ketone (PEEK). Underneath the insulator 209 there is a thermally conductive bond 211 (which may be formed, for example, using TRA-CON thermally conductive epoxy, sold by Henkel AG & Co. KGaA of Düsseldorf, Germany) and a water cooled base 212. The adhesion coating 204 may extend down an edge of the electrostatic chuck (including down the edges of the gas seal rings) to form a metals reduction layer 213, which prevents beam strikes on the edges of the electrostatic chuck from causing aluminum particles to strike the substrate.

In accordance with an embodiment of the invention, the polyetherimide (PEI) used for the protrusions 201, charge control layer 202 or other components of the electrostatic chuck may be formed of unfilled amorphous polyether imide (PEI), in a thickness of between about 12 microns and about 25 microns. For example, PEI sold under the tradename ULTEM 1000 may be used, sold by Sabic Innovative Plastics Holdings BV. Where the protrusions 201 and/or charge control layer 202 or other components are formed of polyether ether ketone (PEEK), they may be made from unfilled PEEK, in a thickness of between about 12 microns and about 25 microns. For example, PEEK sold under the trade name Victrex® APTIV PEEK™ FILM, 2000-006 (unfilled amorphous grade) may be used, sold by Victrex U.S.A., Inc. of West Conshohocken, Pa., U.S.A.

An electrostatic chuck featuring polymer protrusions and a polymer charge control layer in accordance with an embodiment of the invention may include features of the electrostatic chuck of U.S. patent application Ser. No. 12/454,336, filed on May 15, 2009, published as U.S. Patent Application Publication No. 2009/0284894, the teachings of which are hereby incorporated by reference in their entirety. In particular, features relating to equally spaced protrusions, trigonal pattern protrusions and low particle production may be included, and other features may also be included.

Figure 3:
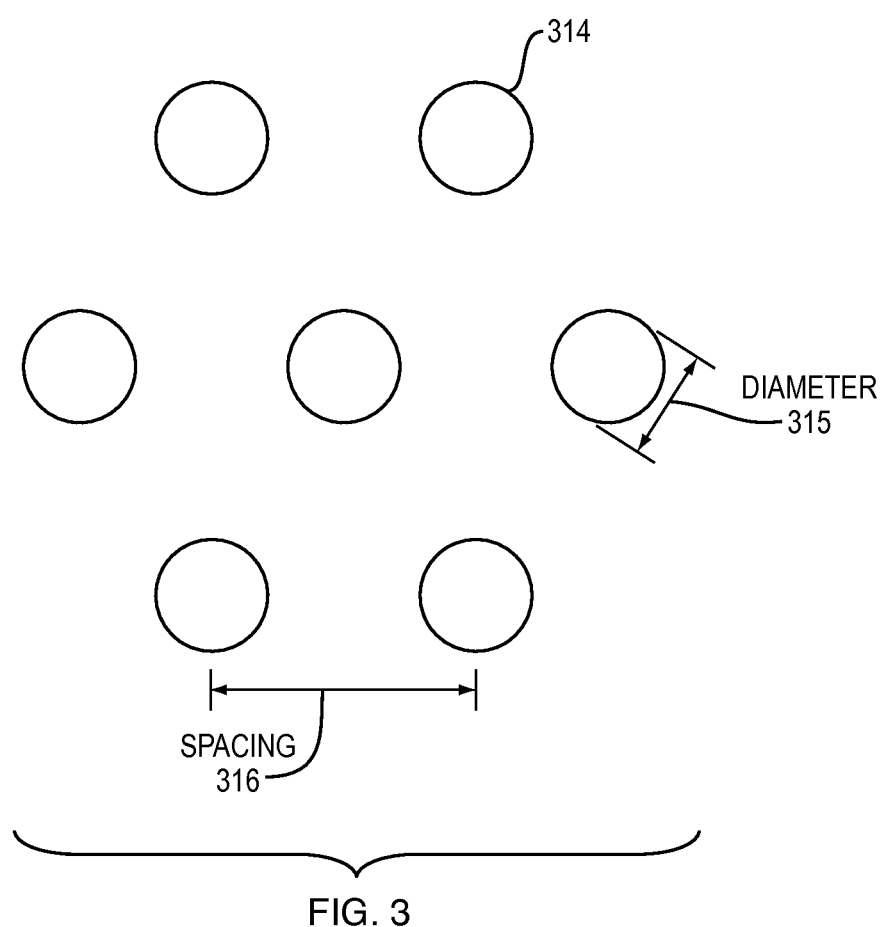
FIG. 3 is an illustration of a pattern of protrusions on the surface of an electrostatic chuck in accordance with an embodiment of the invention.

FIG. 3 is an illustration of a pattern of protrusions 314 on the surface of an electrostatic chuck, in accordance with an embodiment of the invention, in which the protrusion pattern is used to reduce the forces between a substrate and the protrusions 314. Protrusion patterns that equally distribute such forces may be used, for example trigonal or generally hexagonal patterns of protrusions. It should be appreciated that, as used herein, a "trigonal" pattern is intended to mean a regularly repeating pattern of equilateral triangles of protrusions, such that the protrusions are substantially equally spaced apart. (Such a pattern may also be viewed as being generally hexagonal in shape, with a central protrusion in the center of an array of six protrusions that form the vertices of a regular hexagon). Forces may also be reduced by increasing the diameter 315 of the protrusions, or by decreasing the center-to-center spacing 316 of the protrusions 314. As shown in the embodiment of FIG. 3, the protrusions may be disposed in an equally spaced arrangement, in which each protrusion is substantially equally spaced apart from the adjacent protrusions by a center to center spacing dimension 316. By virtue of such spacing, a substantial portion of the back side of the substrate contacts the top portion of the protrusions, leaving a gap between the protrusions for helium or other gas for back side cooling. By contrast, without such protrusion spacing, only a small portion, 10% or less, of the protrusions may contact the substrate. In accordance with an embodiment of the invention the substrate may contact greater than 25% of the protrusion's top surface area.

In one example, the electrostatic chuck may be a 300 mm configuration, including an aluminum base, an alumina insulator 209 of about 0.120 inches in thickness, an alumina dielectric 205 of about 0.004 inches thickness, and having a rotary platen design to allow rotating and tilting of the substrate that is mounted to the electrostatic chuck. The diameter of the electrostatic chuck may, for example, be 300 mm, 200 mm or 450 mm. The protrusions 314 may be in a trigonal pattern, with a center to center spacing dimension 316 of from about 6 mm to about 8 mm, for example. The diameter 315 of the protrusions may, for example, be about 900 microns. The height of the protrusions 314 may, for example, be from about 3 microns to about 12 microns, such as about 6 microns. The protrusions 314 may be formed entirely of polymer, as may be the charge control layer 202 (see FIG. 2).

Figure 4:
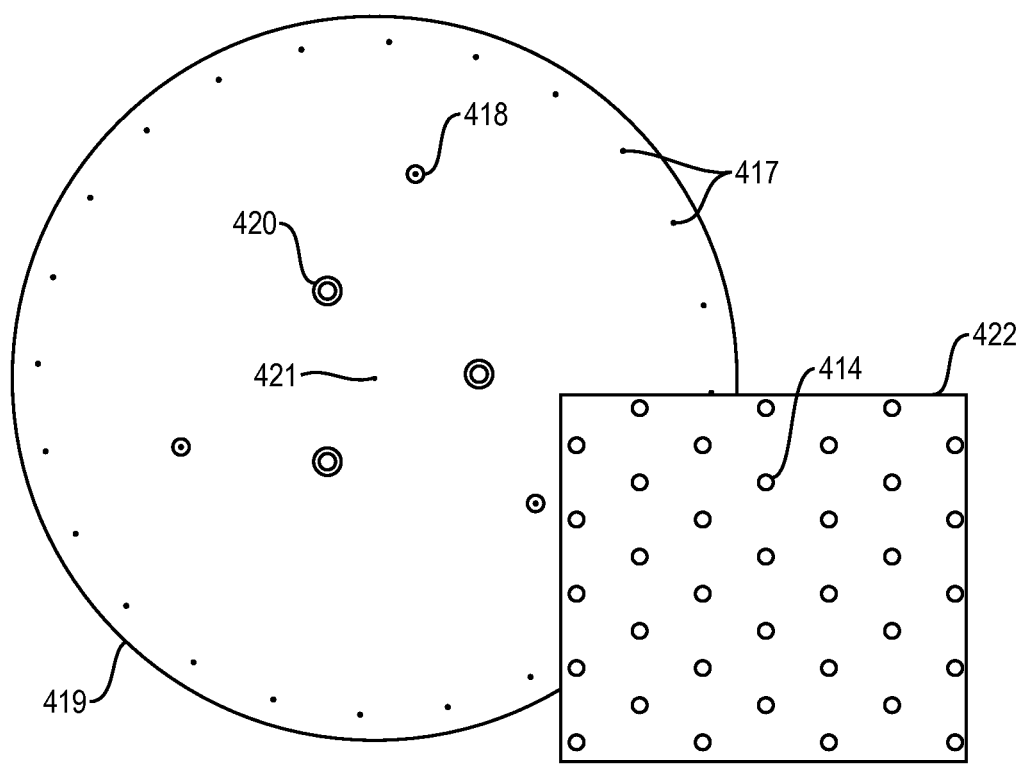
FIG. 4 is a diagram of the surface appearance of an electrostatic chuck in accordance with an embodiment of the invention.

FIG. 4 is a diagram of the surface appearance of an electrostatic chuck in accordance with an embodiment of the invention. The electrostatic chuck surface includes gas inlets 417, a ground pin passage 418, a gas seal ring 419, a lift pin passage 420 that includes its own gas seal ring (outer light-colored structure of lift pin passage 420 in FIG. 4), and a small gas inlet at 421 in the center of the chuck (inlet not visible in FIG. 4). The ground pin passage 418 may include its own gas seal ring (outer ring of ground pin passage 419 in FIG. 4). A detail view (inset 422 in FIG. 4) shows the protrusions 414. The gas seal ring 419 (and the gas seal rings of the lift pin passages 420 and ground pin passages 418) may be about 0.1 inches in width and may have an equal height to that of the protrusions 414, such as from about 3 microns to about 12 microns, for example about 6 microns, although other widths and heights are possible.

In accordance with an embodiment of the invention, an electrostatic chuck may be made by the process of, first, preparing the ceramic assembly using a ceramic to ceramic bond. For example, the dielectric layer 205 may be bonded to the insulator layer 209 using the bonding substances described above in connection with the embodiment of FIG.

2. Next, the ceramic assembly is coated with the adhesion coating 204, such as the substances discussed above in connection with the embodiment of FIG. 1, to a thickness of about 1 or 2 microns. Next, the polymer substance that will make up the charge control layer 202 and protrusions 201 is bonded to the surface of the adhesion coating 204. The top of the polymer substance may then be plasma treated to help photoresist (applied next) to stick. Next, photoresist is deposited on the polymer substance, and is exposed and developed. Next, a reactive ion etch process is used to remove a thickness of the polymer substance (such as between about 3 microns and about 12 microns, in particular about 6 microns) to create the areas between the protrusions 201. The amount etched away (resulting in the height of the protrusions) may be optimized for the back side gas pressure that will be used with the electrostatic chuck. The height of the protrusions is preferably approximately the same as, or substantially equal to, the mean free path of the gas used in back side cooling. After etching, the photoresist is then stripped off, and the process proceeds to final assembly of the electrostatic chuck.

Figure 5:
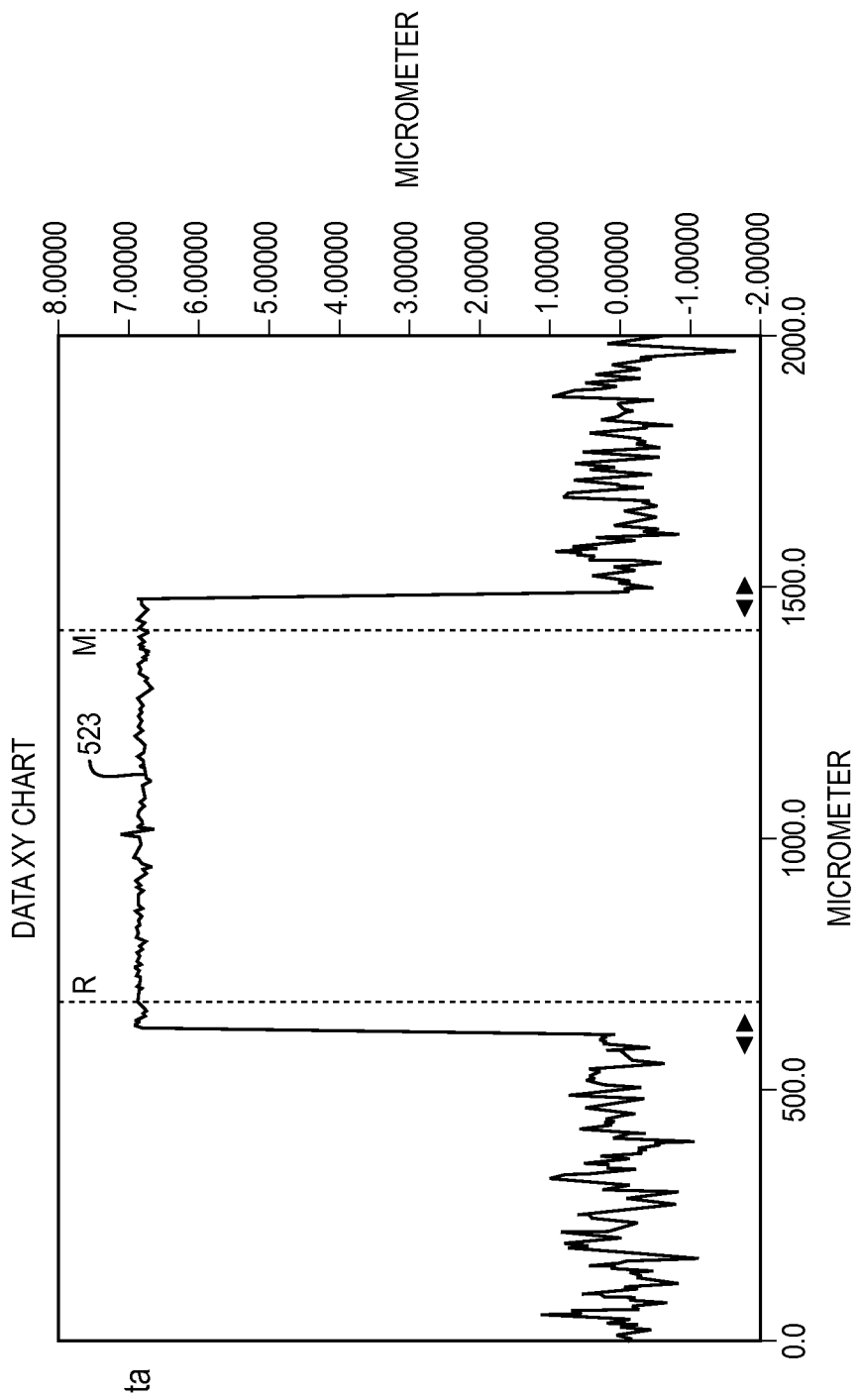
FIG. 5 is a diagram of the profile of a protrusion on an electrostatic chuck in accordance with an embodiment of the invention.

FIG. 5 is a diagram of the profile of a protrusion on an electrostatic chuck in accordance with an embodiment of the invention. The width and height are shown in micrometers. The protrusion is about 6 microns in height, and has a very smooth wafer contact surface 523. For example, the protrusion may have a surface roughness on the wafer contact surface 523 of about 0.02 to about 0.05 μm. Likewise, the gas seal rings may have a similarly smooth surface, which results in a good seal with the substrate. Table 1, below, shows the results of a gas leak rate experiment in accordance with an embodiment of the invention. The left column shows the back side gas pressure applied, the right column shows the back side gas flow, which occurs as a result of gas leaks out from under the edges of the electrostatic chuck, and the middle column shows the chamber pressure, which will rise as more gas leaks out the edge of the electrostatic chuck. Results of less than 1 sccm back side gas flow rate (as here) are considered desirable.

TABLE 1

Gas Leak Rate Test

| BSG Pressure (Torr) | Chamber Pressure (Torr) | BSG Flow (sccm) |
| --- | --- | --- |
| 0 | 2.44E−06 | na |
| 4 | 5.17E−06 | 0.09 |
| 10 | 9.04E−06 | 0.34 |
| 15 | 1.24E−05 | 0.56 |
| 25 | 2.02E−065 | 1.1 |

In accordance with an embodiment of the invention, the gas seal rings of the electrostatic chuck may comprise a surface roughness of less than about 8 microinches, or less than about 4 microinches, or less than about 2 microinches, or less than about 1 microinches.

In another embodiment according to the invention, a photo-patternable polymer may be used to form protrusions and gas seals on an electrostatic chuck. As used herein, a "photo-patternable polymer" is a polymer whose surface may be patterned based on the results of a photochemical reaction.

Figure 6:
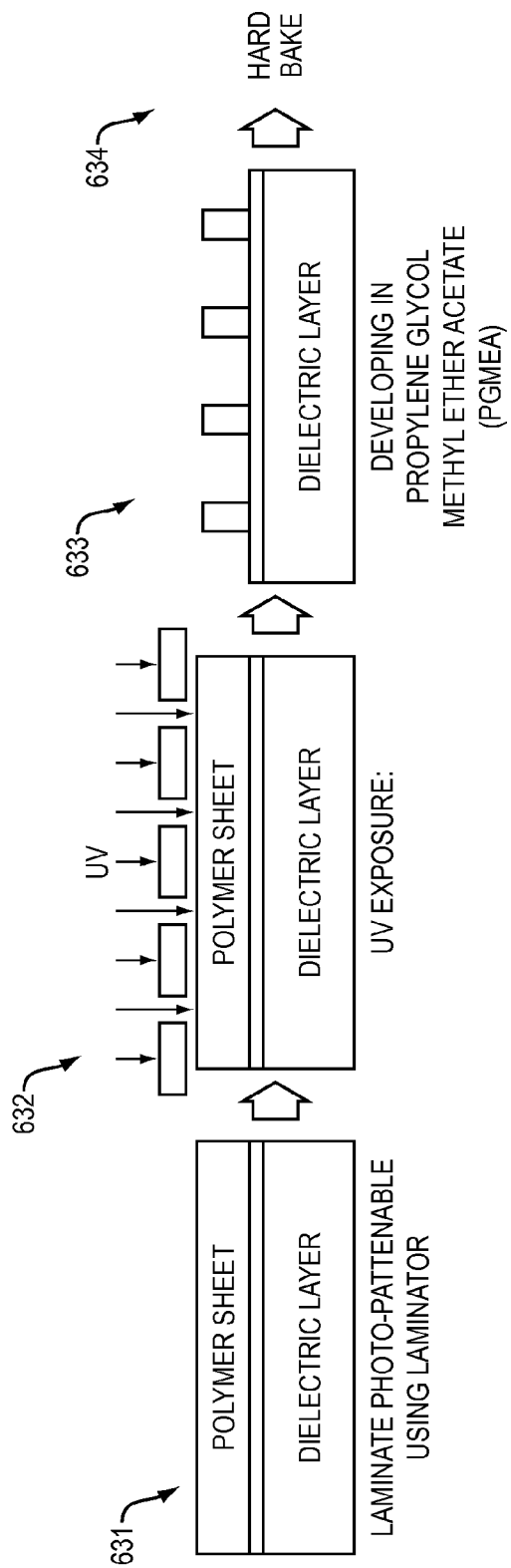
FIG. 6 is a schematic diagram illustrating use of a lamination process in manufacturing of an electrostatic chuck using a photo-patternable polymer, in accordance with an embodiment of the invention.

FIG. 6 is a schematic diagram illustrating use of a lamination process in manufacturing of an electrostatic chuck using a photo-patternable polymer, in accordance with an embodiment of the invention. A photo-patternable polymer sheet is laminated 631 onto the electrostatic chuck. For example, a laminator using two rollers may apply a controlled heat and pressure to laminate the photo-patternable polymer sheet onto the electrostatic chuck. A soft bake process may be applied to the laminated sheet. Subsequently, an ultra-violet light exposure system is used 632 to expose the photo-patternable polymer, through a mask; and a developer is used 633 to remove undesired portions of the polymer that were not exposed through the mask, thereby producing the protrusions. Alternatively, the developer may be used to remove portions of the polymer that were exposed through the mask, depending on the type of photoresist used, in order to produce the protrusions. More generally, areas of the surface of the electrostatic chuck may be removed based on a pattern of exposure of the surface to the light through the mask, thereby producing the protrusions. An oven and hot plate is then used to hard bake 634 the protrusions. Some examples of photo-patternable polymer sheets that may be used include epoxy-based polymer sheets, polyimide-based polymer sheets and benzocyclobutene (BCB) polymer sheets. For example, epoxy-based polymer sheets such as the PerMx™ series, MX series and Riston® series polymer sheets sold by E.I. DuPont de Nemours and Company of Wilmington, Del., U.S.A., may be used.

Figure 7:
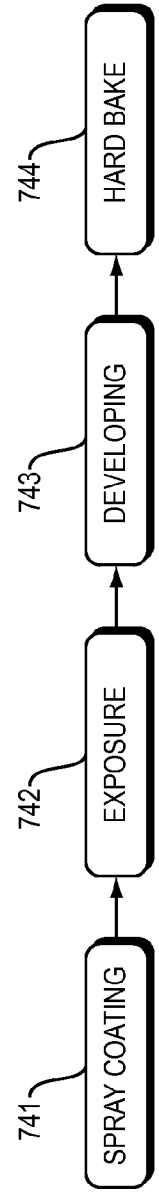
FIG. 7 is a block diagram illustrating use of a spray coating process in manufacturing of an electrostatic chuck using a photo-patternable polymer, in accordance with an embodiment of the invention.

FIG. 7 is a block diagram illustrating use of a spray coating process in manufacturing of an electrostatic chuck using a photo-patternable polymer, in accordance with an embodiment of the invention. A liquid photo-patternable polymer is spray-coated 741 onto the electrostatic chuck. For example, a spray coating system may apply the liquid polymer to the electrostatic chuck, with a controlled heat on the electrostatic chuck and a controlled flow rate to the nozzle of the spray coating system. The desired thickness of polymer (for example, anywhere from sub-micrometer to millimeter thickness) may be precisely sprayed onto the surface of the electrostatic chuck. Subsequently, an ultra-violet light exposure system is used to expose 742 the photo-patternable polymer, through a mask; and a developer is used 743 to remove undesired portions of the polymer that were not exposed through the mask, thereby producing the protrusions. Alternatively, the developer may be used to remove portions of the polymer that were exposed through the mask, depending on the type of photoresist used, in order to produce the protrusions. More generally, areas of the surface of the electrostatic chuck may be removed based on a pattern of exposure of the surface to the light through the mask, thereby producing the protrusions. An oven and hot plate is then used to hard bake 744 the protrusions. Some examples of liquid photo-patternable polymers that may be used include epoxy-based liquid polymers, polyimide-based liquid polymers and benzocyclobutene (BCB) based liquid polymers. For example, epoxy-based liquid polymers that may be used include the SU8 series and KMPR series liquid polymers sold by MicroChem Corporation of Newton, Mass., U.S.A.; and polyimide-based liquid polymers that may be used include the HD4100 series, HD8800 series and HD8900 series liquid polymers sold by Hitachi DuPont MicroSystems, LLC of Wilmington, Del., U.S.A.

In accordance with an embodiment of the invention, where a photo-patternable polymer is used, the thickness of the protrusions determines the clamping force of the electrostatic chuck. Thus, in order to control the clamping force, the thickness of the protrusion can be controlled. For example, the thickness of the protrusion can be controlled by the thickness of the polymer sheet in a lamination process, and by the volume of polymer sprayed in a spray coating process. In addition, when a lamination process is used, the thickness can be changed by treating the protrusion with a reactive ion etch (RIE) process, for example to reduce the thickness of the protrusion. This may also result in the edges of the protrusion being smoother and cleaner.

Further, in accordance with an embodiment of the invention, the hard bake parameters for a photo-patternable polymer can be adjusted according to the application in which the electrostatic chuck is used, and the resulting desired polymer properties. For example, if particles are produced by abrasion of a substrate, which may be discovered in a clamping/declamping cycle test, it may be desirable to make the protrusions softer by decreasing the hard bake temperature and time. On the other hand, if particles from the polymer protrusions are discovered, for example in a clamping/declamping cycle test, it may be desirable to make the protrusions harder by increasing the hard bake temperature and time.

In accordance with an embodiment of the invention, use of a photo-patternable polymer can provide several advantages. It can produce a uniform thickness of protrusions; and can produce non-abrasive and soft protrusions, with Young's modulus and hardness significantly lower than ceramic protrusions (such as diamond like carbon and silicon carbide protrusions). Use of a photo-patternable polymer can improve manufacturability and require less capital equipment, can reduce particulate contamination, can provide better compatibility with grounded surface platen designs, can provide lower cost and higher throughput electrostatic chucks, and can be easier to scale up to larger size electrostatic chucks (such as 450 mm). In addition, photo-patternable polymer protrusions may have better adhesion than other protrusions, and can be used without an adhesion promoter. Further, an electrostatic chuck using photo-patternable polymer protrusions may be more easily refurbished than previous designs. For example, if a protrusion wears off, an oxygen plasma asher can be used to clean the surface, after which the protrusion may be reformed as described herein without disassembling the chuck.

Figure 8:
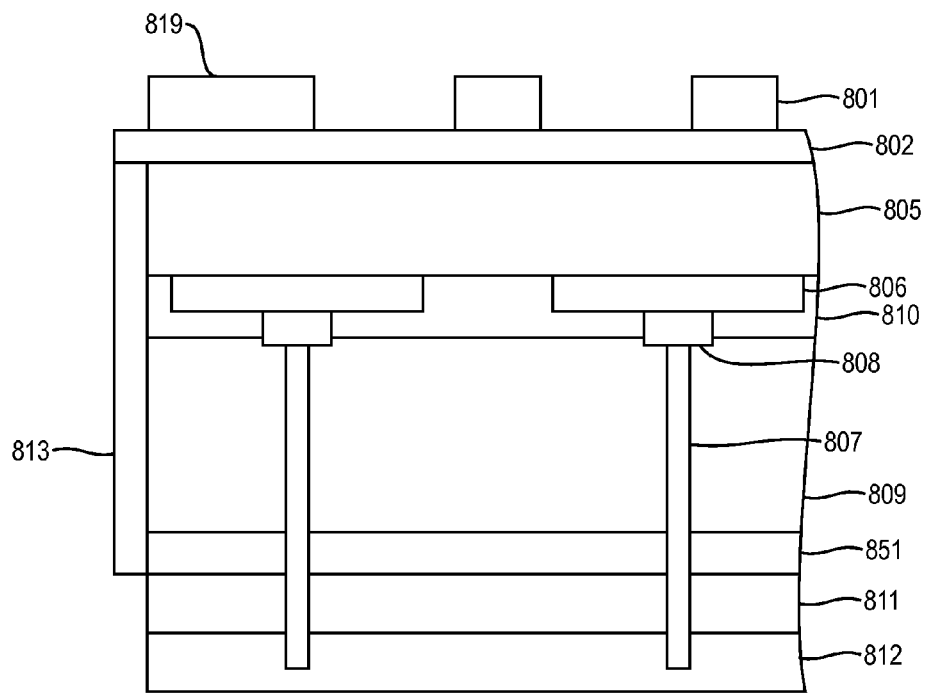
FIG. 8 is a cross-sectional diagram of an electrostatic chuck including polymer protrusions and a grounded layer, in accordance with an embodiment of the invention.

FIG. 8 is a cross-sectional diagram of an electrostatic chuck including polymer protrusions and a grounded layer, in accordance with an embodiment of the invention. The electrostatic chuck includes polymer protrusions 801, which may for example include photo-patternable polymer protrusions, as well as a polymer gas seal 819. In a path for charge to ground, surface charge is bled to a grounded layer 851 through a charge control layer 802 and a conductive path layer 813. The conductive path layer 813 may, for example, be formed of silicon carbide, diamond like carbon and/or a substance used for charge control layers taught elsewhere herein, and may function as a conductive path to ground and also as a metals reduction layer. The grounded layer 851 may, for example, be formed of silicon carbide, diamond like carbon and/or a substance used for charge control layers taught elsewhere herein. The grounded layer 851 may, for example, comprise diamond-like carbon or silicon carbide, and may have a surface resistivity of between about $10^5$ ohms per square and about $10^7$ ohms per square. The electrostatic chuck of the embodiment of FIG. 8 also includes a dielectric layer 805, metal electrodes 806, a ceramic-to-ceramic bond 810, electrically conductive epoxy bonds 808, electrode pins 807, insulator layer 809, thermally conductive bond 811 and water cooled based 812. The dielectric 805 may comprise a bulk resistivity greater than about $10^{12}$ ohm-cm such that the electrostatic chuck is a Coulombic chuck. The charge control layer 802 may, for example, comprise silicon carbide or diamond like carbon; may be directly overlying the dielectric; may comprise a thickness in the range of from about 0.1 microns to about 10 microns; and may comprise a surface resistivity in the range of from about $1 \times 10^8$ ohms/square to about $1 \times 10^{11}$ ohms/square.

Figure 9:
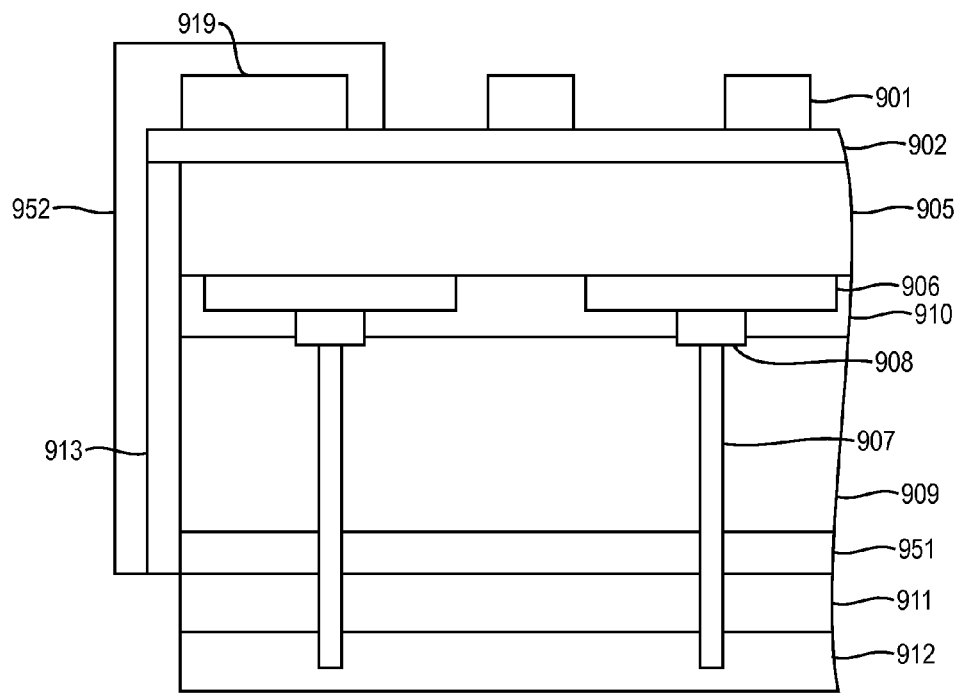
FIG. 9 is a cross-sectional diagram of an electrostatic chuck including polymer protrusions and a conductive path, in accordance with an embodiment of the invention.

FIG. 9 is a cross-sectional diagram of an electrostatic chuck including polymer protrusions and a conductive path, in accordance with an embodiment of the invention. The electrostatic chuck includes polymer protrusions 901, which may for example include photo-patternable polymer protrusions, as well as a polymer gas seal 919. In a path for charge to ground, surface charge is bled to a grounded layer 951 through a charge control layer 902, a conductive path layer 913 and a conductive path 952. The conductive path layer 913 may, for example, be formed of silicon carbide, diamond-like carbon and/or a substance used for charge control layers taught herein, and may function as a conductive path to ground and also as a metals reduction layer. The grounded layer 951 may, for example, be formed of silicon carbide, diamond-like carbon and/or a substance used for charge control layers taught elsewhere herein. The grounded layer 951 may, for example, comprise diamond-like carbon or silicon carbide, and may have a surface resistivity of between about $10^5$ ohms per square and about $10^7$ ohms per square. The conductive path 952 may, for example, comprise diamond-like carbon or silicon carbide, and may have a surface resistivity of between about $10^5$ ohms per square and about $10^7$ ohms per square; and may, for example, cover at least a portion of a workpiece-contacting surface of a gas seal ring 919 of the electrostatic chuck. The electrostatic chuck of the embodiment of FIG. 9 also includes a dielectric layer 905, metal electrodes 906, a ceramic-to-ceramic bond 910, electrically conductive epoxy bonds 908, electrode pins 907, insulator layer 909, thermally conductive bond 911 and water cooled based 912. The dielectric 905 may comprise a bulk resistivity greater than about $10^{12}$ ohm-cm such that the electrostatic chuck is a Coulombic chuck. The charge control layer 902 may, for example, comprise silicon carbide or diamond like carbon; may be directly overlying the dielectric; may comprise a thickness in the range of from about 0.1 microns to about 10 microns; and may comprise a surface resistivity in the range of from about $1 \times 10^8$ ohms/square to about $1 \times 10^{11}$ ohms/square.

Experimental

Manufacturing Using Photo-Patternable Polymer

1. Lamination Process for the Embodiment of FIG. 8:

In accordance with an embodiment of the invention, an electrostatic chuck may be made by the process of, first, preparing the ceramic assembly using a ceramic to ceramic bond 810. For example, the dielectric layer 805 may be bonded to the insulator layer 809 using the bonding substances described above in connection with the embodiment of FIG. 2. Next, the back side of the ceramic assembly is coated with the grounded layer 851 and conductive path layer 813 using Physical Vapor Deposition (PVD), such as by depositing the substances discussed above for use as the grounded layer 851 and conductive path layer 813 in FIG. 8, to a thickness of about 1 micron.

Next, the front side of the ceramic assembly is coated by the charge control layer 802 using Chemical Vapor Deposition (CVD), such as by depositing silicon carbide, diamond like carbon and/or a substance taught elsewhere herein for use as a charge control layer, with the layer 802 being electrically connected with grounded layer 851 via the edge of the ceramic assembly.

Next, the polymer protrusions 801 and gas seal rings 819 are made by photolithography. The photo-patternable polymer sheet is laminated onto the charge control layer 802 by using CATENA (sold by GBC Films Group, Addison, Ill., U.S.A.) with a 0.5 m/min roll speed and a 410-480 kPa pressure at 80 C, and then is baked at 100 C for 5 min. After that, the polymer is exposed to light of an intensity of 300 mJ/cm$^2$. The photo-patternable polymer is baked at 95 C for 5 min and then developed in Propylene Glycol Monomethyl Ether Acetate (PGMEA) for 5 min, followed by Isopropyl Alcohol (IPA) rinsing for 2 min. At the end, the polymer is baked at 180 C for 30 min. In addition, when a lamination process is used, the thickness can be changed by treating the protrusion with a reactive ion etch (RIE) process, for example to reduce the thickness of the protrusion. This may also result in the edges of the protrusion being smoother and cleaner. The thickness of the protrusion is between about 3 microns and about 12 microns, for example about 6 microns. The amount etched away (resulting in the height of the protrusions) may be optimized for the back side gas pressure that will be used with the electrostatic chuck. The height of the protrusions is preferably approximately the same as, or substantially equal to, the mean free path of the gas used in back side cooling.

2. Lamination Process for the Embodiment of FIG. 9:

A process is used similar to that described above for producing the embodiment of FIG. 8, and in addition there is added a Diamond Like Carbon (DLC) coating by a CVD process with a shadow mask, after the polymer protrusions have been made. The DLC coating covers the gas seal ring 819 and the side wall of ceramic assembly.

3. Spray Coating Process for the Embodiment of FIG. 8:

A similar process is used to that described above for lamination, except that a different technique is used to apply the photo-patternable polymer for the protrusions 801 and gas seal ring 819 onto the charge control layer 802.

The polymer protrusions 801 and gas seal ring 819 are made by a photolithography technique. The photo-patternable polymer is sprayed onto the charge control layer 802 using a Prism 300 (sold by Ultrasonic Systems, Inc., Haverhill, Mass., U.S.A.) with a 100 mm/sec spray speed, 2 ml/min flow rate, 30 psi air pressure and 30 mm height (distance between spray head and the surface of the charge control layer 802), and then is baked at 95 C for 15 min. The ceramic assembly is heated up to 65 C during the spray coating process. After that, the polymer is exposed to light of an intensity of 300 mJ/cm$^2$. The photo-patternable polymer is baked at 95 C for 5 min and then developed in Propylene Glycol Monomethyl Ether Acetate (PGMEA) for 5 min, followed by Isopropyl Alcohol (IPA) rinsing for 2 min. At the end, the polymer is baked at 180 C for 30 min. The thickness of the protrusion is between about 3 microns and about 12 microns, for example about 6 microns. The thickness of the protrusions is controlled by the amount of polymer sprayed onto the surface of the charge control layer 802. The thickness of protrusions may be optimized for the back side gas pressure that will be used with the electrostatic chuck. The height of the protrusions is preferably approximately the same as, or substantially equal to, the mean free path of the gas used in back side cooling.

4. Spray Coating Process for the Embodiment of FIG. 9:

A process is used similar to that described above for producing the embodiment of FIG. 8, and in addition there is added a Diamond Like Carbon (DLC) coating by a CVD process with a shadow mask, after the polymer protrusions have been made. The DLC coating covers the gas seal ring 819 and the side wall of ceramic assembly.

Experimental

Test Results

In accordance with an embodiment of the invention a variety of tests were performed on an electrostatic chuck having photo-patternable polymer protrusions described herein. Results were as follows.

1) Scratch test: a needle was used to scratch through a protrusion. The protrusion passed the test; the blade cut through the protrusion without causing delamination.

2) Tape test: a Kapton tape was placed on top of the protrusions, and was then peeled off. The protrusions passed the test; no protrusions peeled off.

3) IPA Wipe test: clean room paper with Isopropyl Alcohol (IPA) was used to wipe the embossments. The protrusions passed the test.

4) Loading/unloading cycle test: a weight was loaded and unloaded onto the top of the protrusions several times. The protrusions passed the test.

5) Glass rubbing test: 15 μm PerMx™ protrusions on a silicon carbide surface were used. Normal stress was manually applied onto the protrusions using glass, while the glass was rubbed against the protrusions. The results were that the thickness of the protrusions did not change. Scratches were found on the top surface of the embossments.

6) Torture tests: Torture tests were performed using a ceramic assembly with 14 μm thick protrusions. In a solvent test, the protrusions were immersed in IPA and acetone for a day respectively. In a UV exposure test, the protrusions were continually exposed to UV light for 10.25 hours. In a cold test, the sample was covered with dry ice at approximately –70 C. After the torture tests, a knife was used to scratch the protrusions. The knife cut through the protrusions without causing delamination and cracks. All protrusions passed the tests.

7) Clamp test: the charging current was measured during clamping of the electrostatic chuck, for both charging and discharging of the electrodes. The waveform was found to stay uniform and properly formed under all operating conditions (including varying back side gas pressures, in vacuum and in air).

8) Gas Leak Rate tests: similar gas leak rate tests were performed to those shown in Table 1, above. No arcing, a high clamp force and a low gas flow rate were found. Similar results were found both before and after a 500K cycle clamp/declamp test.

9) Materials Purity tests: three samples were made (photo-patternable polymer film; laminated photo-patternable polymer film on silicon wafer without additional processing; and fully formed photo-patternable polymer protrusions on a silicon wafer). The three samples were surface-extracted using 5% HNO3 for one hour at room temperature and the resulting solutions were measured for 19 metals using inductively coupled plasma mass spectrometry (ICP-MS). The results found acceptably low levels of atoms per square centimeter of the 19 metals.

10) Clamp/Declamp Cycle Test: After a 500K cycle clamp/declamp test, the height and roughness of protrusions and gas seals did not change. Table 2 shows the results. Profilometry showed that the shapes of the protrusions and gas seals likewise did not change.

TABLE 2

Height and Roughness after 500K Cycle Test

| | Before cycle test | | After 500k cycle | |
|---|---|---|---|---|
| | H (um) | $R_a$ (um) | H (um) | $R_a$ (um) |
| Embossment 1 | 4.9 | 0.027 | 5.0 | 0.03 |
| Embossment 2 | 5.0 | 0.027 | 4.99 | 0.025 |
| Embossment 3 | 4.95 | 0.038 | 5.35 | 0.025 |
| Embossment 4 | 5.3 | 0.028 | 4.96 | 0.04 |
| Embossment 5 | 5.1 | 0.03 | 4.99 | 0.03 |
| Ave | 5.05 | 0.03 | 5.05 | 0.03 |
| Stdv | 0.158 | 0.0046 | 0.16 | 0.006 |
| Gas seal | 3.3 | 0.03 | 5.06 | 0.049 |

In accordance with an embodiment of the invention, photo-patternable polymer protrusions may be used that include materials of low Young's modulus and high tensile strength. Table 3 shows a comparison of mechanical properties of various materials, with the PerMX and SU8 materials being examples of epoxy based photo-patternable polymers. It can be seen in Table 3 that the thermal stability of polyether imide (PEI), epoxy and polyimide are similar; but the tensile strength of epoxy and polyimide based polymers are higher than PEI. The elastic modulus (stiffness) of PEI, epoxy and polyimide are similar, and all of them are softer than diamond like carbon (DLC). In accordance with an embodiment of the invention, a polymer substance may be used for protrusions that has a tensile strength of greater than about 70 megapascals (MPa), such as between about 70 MPa and 80 MPa; and that has a Young's modulus of less than about 3.5 gigapascals (GPa), such as between about 2 GPa and 3 GPa. Other substances may be used.

TABLE 3

Mechanical Properties of Protrusion Materials

| | Film | | Liquid | | |
|---|---|---|---|---|---|
| | PEI | PerMx | SU8 | Polyimide | DLC |
| Tg (° C.) | 216 | 220 | 200 | 270 | |
| Tensile Strength (Mpa) | 0.12 | 75 | 73 | 114 | |
| Young's Modulus (Gpa) | 3.1 | 3.2 | 2 | 2 | 100-500 |
| Solvent Resistant | Good | Good | Good | Good | |
| Properties adjustable by Hard bake? | No | Yes | Yes | Yes | |

In accordance with an embodiment of the invention, the hardness of polymer protrusions, such as epoxy photo-patternable polymer protrusions, may be between about 350 MPa and about 450 MPa. The bonding strength of the polymer protrusions may be greater than about 15 MPa between the polymer protrusions and an underlying charge control layer. In some embodiments, the adhesion of the polymer protrusions may be sufficient to permit the charge control layer (802 of FIG. 8) to be adhered directly to the dielectric 805, without an intervening adhesion layer or adhesive. After clamping a wafer or other substrate to the polymer protrusions, the metallic contaminants (for example, Li, Mg, K, Ca, Ti, Cr, Mn, Fe, Co, Ni, Cu, Zn, Ge, Y, Mo, Sn, Ba, Ce, Hf, Ta, W, Pb, Sb) transferred from the polymer protrusions to the wafer backside may be less than about 1E10 atom/cm². After clamping a wafer or other substrate to the polymer protrusions, the particles deposited on the back side of the substrate as a result of the use of the electrostatic chuck may be less than about 2000 particle adders of particle size range of 0.16 μm or greater.

In accordance with an embodiment of the invention, photo-patternable polymer protrusions set forth herein may, for example, be produced as set forth herein, to adhere to an underlying charge control layer. The charge control layer may, for example, include silicon carbide, diamond like carbon, or another material. Such a charge control layer may have a surface resistivity between about $10^8$ ohms per square to about $10^{11}$ ohms per square.

In another embodiment according to the invention, photo-patternable protrusions set forth herein may be used on a grounded electrostatic chuck, for example as shown in the embodiments of FIGS. 8 and 9. For example, a grounding technique may include a conductive path covering at least a portion of a workpiece-contacting surface of a gas seal ring of the electrostatic chuck, the conductive path comprising at least a portion of an electrical path to ground. The conductive path may, for example, comprise diamond-like carbon or silicon carbide, and may have a surface resistivity of between about $10^5$ ohms per square and about $10^7$ ohms per square. Other conductive paths may be used that are taught in International Application No. PCT/US2011/050841, published as WO2012/033922, entitled "High Conductivity Electrostatic Chuck," the entire teachings of which are hereby incorporated herein by reference. For example, teachings related to conductive paths covering over the outside edges of electrostatic chucks may be used.

Although photo-patternable polymers are discussed herein, similar spray-coating methods may be used with other soft materials, in accordance with an embodiment of the invention. For example, conductive polymers, high chemical-resistance polymers, high temperature resistant polymers, and other materials may be spray coated with a shadow mask to make soft protrusions for electrostatic chucks. In one example, conductive polymers may be spray coated to form conductive soft embossments for a grounded electrostatic chuck. For example, the conductive polymers may comprise a blend of a carbon nanotube and a polymer (such as Entegris TEGO™ polymer, sold by Entegris, Inc. of Billerica, Mass., U.S.A.); a carbon nanotube filled polycarbonate; and/or a conductive nanoparticle doped polymer. Such conductive polymer protrusions may be used with a wrap-around DLC coating for grounding of the electrostatic chuck, such as one of the conductive paths that are taught in International Application No. PCT/US2011/050841, published as WO2012/033922, entitled "High Conductivity Electrostatic Chuck," the entire teachings of which are hereby incorporated herein by reference. Various features of embodiments described herein may be combined; for example, heights and surface roughnesses of protrusions discussed herein may be obtained with a variety of different protrusions, including photo-patternable protrusions taught herein.

In addition, in accordance with an embodiment of the invention, polymers taught herein, including photo-patternable polymers, conductive polymers, high chemical-resistance polymers and high temperature resistant polymers, may be used for protrusions on vacuum chucks and mechanical chucks.

In accordance with an embodiment of the invention, an electrostatic chuck is a Coulombic chuck. The dielectric can include aluminum, for example alumina or aluminum nitride. In a further embodiment according to the invention, an electrostatic chuck is a Johnsen-Rahbek electrostatic chuck. Alternatively, the electrostatic chuck may not be a Johnsen-Rahbek electrostatic chuck, and the dielectric may be chosen so that a Johnsen-Rahbek (JR) force or partial hybrid Johnsen-Rahbek force does not act on the wafer or substrate.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. An electrostatic chuck comprising:
a surface layer activated by a voltage in an electrode to form an electric charge to electrostatically clamp a substrate to the electrostatic chuck, the surface layer including a plurality of protrusions comprising a photo-patternable polymer and a charge control layer to which the plurality of polymer protrusions adhere, the plurality of polymer protrusions extending to a height above portions of the charge control layer surrounding the plurality of polymer protrusions to support the substrate upon the plurality of polymer protrusions during electrostatic clamping of the substrate.

2. An electrostatic chuck according to claim 1, wherein the photo-patternable polymer comprises a photo-patternable polymer that is liquid at room temperature prior to baking.

3. An electrostatic chuck according to claim 1, wherein the photo-patternable polymer comprises a photo-patternable polymer that is solid at room temperature prior to baking.

4. An electrostatic chuck according to claim 1, wherein the photo-patternable polymer comprises an epoxy based photo-patternable polymer.

5. An electrostatic chuck according to claim 1, wherein the photo-patternable polymer comprises at least one of a polyimide based photo-patternable polymer and a benzocyclobutene based photo-patternable polymer.

6. An electrostatic chuck according to claim 1, wherein the charge control layer comprises silicon carbide.

7. An electrostatic chuck according to claim 1, wherein the charge control layer comprises diamond like carbon.

8. An electrostatic chuck according to claim 1, wherein the charge control layer comprises a surface resistivity of between about $10^8$ ohms per square to about $10^{11}$ ohms per square.

9. An electrostatic chuck according to claim 1, wherein the polymer protrusions comprise a height of between about 3 microns and about 12 microns.

10. An electrostatic chuck according to claim 1, wherein the polymer protrusions comprise a diameter of about 900 microns.

11. An electrostatic chuck according to claim 1, further comprising a gas seal ring comprising a photo-patternable polymer.

12. An electrostatic chuck according to claim 11, wherein the gas seal ring comprises at least one of an epoxy based photo-patternable polymer, a benzocyclobutene based photo-patternable polymer and a polyimide based photo-patternable polymer.

13. An electrostatic chuck according to claim 1, wherein the plurality of polymer protrusions comprise a surface roughness of between about 0.02 µm and about 0.05 µm.

14. An electrostatic chuck according to claim 1, wherein the photo-patternable polymer comprises a material having a tensile strength of greater than about 70 megapascals (MPa).

15. An electrostatic chuck according to claim 1, wherein the photo-patternable polymer comprises a material having a Young's modulus of less than about 3.5 gigapascals (GPa).

16. An electrostatic chuck according to claim 1, further comprising a conductive path covering at least a portion of a workpiece-contacting surface of a gas seal ring of the electrostatic chuck, the conductive path comprising at least a portion of an electrical path to ground.

17. An electrostatic chuck according to claim 16, wherein the conductive path comprises diamond-like carbon.

18. An electrostatic chuck according to claim 16, wherein the photo-patternable polymer comprises a photo-patternable polymer that is liquid at room temperature prior to baking, and wherein the charge control layer comprises a surface resistivity of between about $10^8$ ohms per square to about $10^{11}$ ohms per square.

19. An electrostatic chuck comprising:
a surface layer activated by a voltage in an electrode to form an electric charge to electrostatically clamp a substrate to the electrostatic chuck, the surface layer including a plurality of protrusions comprising a conductive polymer and a charge control layer to which the plurality of polymer protrusions adhere, the plurality of polymer protrusions extending to a height above portions of the charge control layer surrounding the plurality of polymer protrusions to support the substrate upon the plurality of polymer protrusions during electrostatic clamping of the substrate.

20. An electrostatic chuck according to claim 19, wherein the conductive polymer comprises a polymer from the group consisting of: a blend of a carbon nanotube and a polymer; and a conductive nanoparticle doped polymer.

21. A method of manufacturing an electrostatic chuck, the method comprising:
exposing a photo-patternable polymer, on a surface of the electrostatic chuck, to light through a mask, the electrostatic chuck comprising a charge control layer underlying at least a portion of the photo-patternable polymer; and
removing areas of the surface of the electrostatic chuck based on a pattern of exposure of the surface to the light through the mask, thereby forming a plurality of polymer protrusions on the surface of the electrostatic chuck, the plurality of polymer protrusions adhering to the charge control layer and extending to a height above portions of the charge control layer surrounding the plurality of polymer protrusions.

22. A method according to claim 21, comprising laminating a polymer sheet including the photo-patternable polymer over at least a portion of the charge control layer.

23. A method according to claim 21, comprising spraying a liquid polymer including the photo-patternable polymer over at least a portion of the charge control layer.

24. A method according to claim 21, wherein the photo-patternable polymer comprises a material having a tensile strength of greater than about 70 megapascals (MPa) and having a Young's modulus of less than about 3.5 gigapascals (GPa).

25. A method according to claim 21, further comprising covering at least a portion of a workpiece-contacting surface of a gas seal ring of the electrostatic chuck with a conductive path, the conductive path comprising at least a portion of an electrical path to ground.

* * * * *